United States Patent [19]

Zahn et al.

[11] Patent Number: 5,358,823

[45] Date of Patent: Oct. 25, 1994

[54] RADIATION-SENSITIVE COMPOSITION CONTAINING ESTERIFICATION PRODUCT OF (1,2-NAPHTHOQUINONE-2-DIAZIDE)-SULFONIC ACID WITH 2,3,4,4'-TETRAHYDROXYBENZOPHENONE AND A DI- OR TRI-HYDROXYBENZOPHENONE

[75] Inventors: Wolfgang Zahn, Eltville, Fed. Rep. of Germany; Hans-Joachim Merrem, Basking Ridge, N.J.; Fritz Erdmann, Eltville-Martinsthal; Axel Schmitt, Walluf, both of Fed. Rep. of Germany

[73] Assignee: Hoechst Aktiengesellschaft, Frankfurt am Main, Fed. Rep. of Germany

[21] Appl. No.: 863,681

[22] Filed: Apr. 1, 1992

[30] Foreign Application Priority Data

Apr. 9, 1991 [DE] Fed. Rep. of Germany ....... 4111445

[51] Int. Cl.⁵ .............................................. G03F 7/023
[52] U.S. Cl. ..................................... 430/165; 430/168; 430/191; 430/192; 430/193
[58] Field of Search ............... 430/192, 193, 165, 191, 430/168

[56] References Cited

U.S. PATENT DOCUMENTS 4,871,645 10/1989 Uenishi et al. .................... 430/193
5,143,814 9/1992 Pampalone ........................ 430/191

FOREIGN PATENT DOCUMENTS 0055814 7/1982 European Pat. Off. .
0295626 12/1988 European Pat. Off. .
63-249143 10/1988 Japan .
64-49038 2/1989 Japan .
1-222255 9/1989 Japan .
2-109051 4/1990 Japan .

OTHER PUBLICATIONS

Kosar, "Light–Sensitive Systems", John Wiley & Sons, New York, 1965 pp. 336–353.
H. Münzel et al., *Microelectronic Engineering*, vol. 6, 1987, pp. 421–426.
P. Trefonas III et al., *SPIE Advances in Resist Technology and Processing IV*, vol. 771, pp. 194–210 (1987).

*Primary Examiner*—Charles L. Bowers, Jr.
*Assistant Examiner*—Christopher G. Young
*Attorney, Agent, or Firm*—Foley & Lardner

[57] ABSTRACT

A radiation-sensitive composition is disclosed comprising a polymeric binder which is insoluble in water, but soluble or at least swellable in aqueous alkaline solution and a 2,3,4,4'-tetrahydroxybenzophenone which is partially esterified with (1,2-naphthoquinone 2-diazide)-4- and/or -5-sulfonic acid, which additionally contains either a dihydroxybenzophenone which is completely esterified with (1,2-naphthoquinone 2-diazide)-4- and/or -5-sulfonic acid or a trihydroxybenzophenone which is partially or completely esterified with (1,2-naphthoquinone 2-diazide)-4- and/or -5-sulfonic acid. The weight ratio of esterified 2,3,4,4'-tetrahydroxybenzophenone to esterified di- or trihydroxybenzophenone varies between about 4:6 and 7:3 and the esterified hydroxybenzophenones, as a whole, are present in a proportion of 5 to 40% by weight, based on the total weight of solids contained in the composition. Also disclosed is a radiation-sensitive recording material comprising a support and a layer containing this composition, which is present on the support.

20 Claims, No Drawings

RADIATION-SENSITIVE COMPOSITION CONTAINING ESTERIFICATION PRODUCT OF (1,2-NAPHTHOQUINONE-2-DIAZIDE)-SULFONIC ACID WITH 2,3,4,4'-TETRAHYDROXYBENZOPHENONE AND A DI- OR TRI-HYDROXYBENZOPHENONE

BACKGROUND OF THE INVENTION

The invention relates to a radiation-sensitive composition containing esters of (1,2-naphthoquinone 2-diazide)-4- and/or -5-sulfonic acid with at least two different hydroxybenzophenones and a radiation-sensitive recording material prepared therewith.

Important stages in the production of electronic components are the imagewise exposure and the following development of radiation-sensitive layers applied to the material which is to be provided with a pattern.

Suitable radiation-sensitive layers generally contain a resinous binder which is insoluble in water and soluble or at least swellable in aqueous alkaline solutions and at least one radiation-sensitive compound and, if appropriate, further additives. The photoactive components used in positive-working layers are in most cases derivatives of 1,2-naphthoquinone 2-diazides.

A plurality of derivatives of this type, e.g., esters of (1,2-naphthoquinone 2-diazide)-sulfonic acids with aromatic hydroxyl compounds, are known in the art and are employed as radiation-sensitive components in positive-working recording materials. In his book "Light-Sensitive Systems," published by John Wiley & Sons, New York, 1965, pages 343 to 351, Jaromir Kosar has described a number of radiation-sensitive naphthoquinone diazides.

The esters of (naphthoquinone diazide)-sulfonic acids with polyhydroxylated benzophenones, in particular with 2,3,4-trihydroxybenzophenone and with 2,3,4,4'-tetrahydroxybenzophenone are customarily used and have been described in many publications.

The advancing miniaturization of electronic components requires the production of progressively smaller patterns. Radiation-sensitive layers, so-called "photoresists", are therefore required, which have an increasingly higher resolving power. It is known that the resolving power can be improved by increasing the diazoquinone content in the radiation-sensitive layer (H. Muenzel, J. Lux, R. Schulz, "A- and B-Parameter Dependent Submicron Stepper Performance of Positive Type Photoresist," Microelectronic Engineering 6, 1987, pages 421 to 426). It is moreover known that polyfunctional diazonaphthoquinones can enhance contrast and resolution in photoresists (P. Trefonas III, B. K. Daniels, "New Principle for Image Enhancement in Single Layer Positive Photoresists," Proceedings of SPIE, 771, 1987, pages 194 to 210).

Polyfunctional diazonaphthoquinones which are excellently suitable for use as radiation-sensitive components in positive-working photoresists comprise the tetraesters of (1,2-naphthoquinone 2-diazide)-4- and -5-sulfonic acid with 2,3,4,4'-tetrahydroxybenzophenone. However, since these compounds have a relatively low solubility, the concentration thereof in the radiation-sensitive compositions can only be increased to a degree which is insufficient to obtain an improved resolving power.

Depending upon the degree of esterification, 2,3,4,4'-tetrahydroxybenzophenone which is not completely esterified with naphthoquinone diazide sulfonic acid may also be a suitable radiation-sensitive component for positive-working photoresists, but the storage stability of these photoresists is very limited.

JP-A 01-222255, 01-49038 (1989) and 63-249143 (1988) have already described measures to obviate these disadvantages. According to these publications, the storage stability of resists was improved, either by a special purification of the radiation-sensitive component or by using dimethyl formamide as a solvent. It is, however, desirable to prevent expensive purification treatments and use only solvents whose physical characteristics (boiling point, etc.) do not impair the lithographic properties of the resists and which are absolutely non-toxic.

SUMMARY OF THE INVENTION

Accordingly, it is an object of the present invention to provide a radiation-sensitive composition based on esters of hydroxybenzophenones and (1,2-naphthoquinone 2-diazide)-4- and/or -5-sulfonic acid, which has at least equally good lithographic properties as a composition prepared with an ester of 2,3,4,4'-tetrahydroxybenzophenone and (1,2-naphthoquinone 2-diazide)-4- or -5-sulfonic acid, without showing the disadvantages of a composition so prepared.

Another object of the present invention is to provide a radiation-sensitive recording material employing the novel composition.

In accomplishing the foregoing objectives, there has been provided, in accordance with one aspect of the present invention, a radiation-sensitive composition comprising a polymeric binder which is insoluble in water but soluble or at least swellable in aqueous alkaline solution, and an ester mixture comprising (i) a 2,3,4,4'-tetrahydroxybenzophenone which is partially esterified with at least one of (1,2-naphthoquinone 2-diazide)-4-sulfonic acid and (1,2-naphthoquinone 2-diazide)-5-sulfonic acid, and (ii) a compound selected from the group consisting of a dihydroxybenzophenone which is completely esterified with at least one of (1,2-naphthoquinone 2-diazide)-4-sulfonic acid and (1,2-naphthoquinone 2-diazide)-5-sulfonic acid, and a trihydroxybenzophenone which is partially or completely esterified with at least one of (1,2-naphthoquinone 2-diazide)-4-sulfonic acid and (1,2-naphthoquinone 2-diazide)-5-sulfonic acid. The weight ratio of esterified 2,3,4,4'-tetrahydroxybenzophenone to esterified di- or trihydroxybenzophenone is between about 4:6 and 7:3, and the ester mixture is present in an amount from about 5 to 40% by weight of the composition, based on the total weight of solids in the composition.

In accordance with another aspect of the present invention there is provided a radiation-sensitive recording material comprising a support and a radiation-sensitive layer applied thereto, wherein the layer comprises a radiation-sensitive composition as described above.

Other objects, features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

There is provided according to the invention a radiation-sensitive composition which, aside from 2,3,4,4'-tetrahydroxybenzophenone which is not completely esterified with (1,2-naphthoquinone 2-diazide)-4- and/or -5-sulfonic acid, additionally contains either a dihydroxybenzophenone which is completely esterified with (1,2 naphthoquinone 2-diazide)-4- and/or -5-sulfonic acid or a trihydroxybenzophenone which is partially or completely esterified with (1,2-naphthoquinone 2-diazide)-4- and/or -5-sulfonic acid.

Esterified trihydroxybenzophenones are preferred over esterified dihydroxybenzophenones; particularly preferred is esterified 2,3,4-trihydroxybenzophenone.

The degree of esterification is chosen to give an esterification product which comprises about 70 to 95% by weight, preferably about 80 to 90% by weight, of the tetraester of 2,3,4,4'-tetrahydroxybenzophenone and about 70 to 100% by weight, preferably about 75 to 95% by weight, in particular about 80 to 90% by weight, of the triester of trihydroxybenzophenone.

The content of triester can also be adjusted by mixing pure triester with trihydroxybenzophenone which is esterified to a correspondingly lower degree.

The weight ratio of the esterified 2,3,4,4'-tetrahydroxybenzophenone to the esterified di- or trihydroxybenzophenone(s) varies between about 4:6 and 7:3, preferably between about 4.5:5.5 and 5.5:4.5.

In the composition of the present invention, the esterified di-, tri- and tetrahydroxybenzophenones can be present as 4-sulfonyl ester, 5-sulfonyl ester, 4-sulfonyl ester along with 5-sulfonyl ester or mixed 4- and 5-sulfonyl esters.

The esters are prepared according to known processes, in general by reacting the polyfunctional hydroxybenzophenones with reactive derivatives of (naphthoquinonediazide)-sulfonic acid, such as the sulfonyl chloride. The reaction is preferably run in inert solvents, such as ketones or chlorinated hydrocarbons, in the presence of inorganic or organic bases, such as sodium carbonate, or tertiary amines, such as triethylamine. It is, however, also possible to prepare the (naphthoquinone diazide) sulfonic acid esters under the conditions of phase transfer catalysis, for example in the system methylene chloride/sodium carbonate solution or tetraalkylammonium hydroxide solution using a suitable catalyst, such as tetrabutylammonium bromide.

The concentration of the (naphthoquinone diazide)-sulfonic acid ester mixture in the radiation-sensitive composition of the present invention can vary within relatively wide limits. In general, the mixture is present in an amount ranging from 5 to 40% by weight, preferably from about 10 to 35% by weight, particularly preferably from about 15 to 30% by weight, based on the weight of the solids content of the composition.

Radiation-sensitive compositions according to the invention further contain a polymeric binder which is insoluble in water, but soluble or at least swellable in aqueous alkaline solution.

Novolak condensation resins which are advantageously employed in many positive-working recording materials on a basis of naphthoquinone diazides have also proved particularly useful and advantageous in the compositions of the present invention. The novolaks can be prepared with phenol, cresol, xylenol and/or trimethylphenol. The condensation partners of these phenolic components comprise aldehydes and ketones. The type and quantity of the novolak resins used can vary depending upon the particular application. In general, the novolak component is present in quantities from about 60 to 95% by weight, preferably from about 65 to 90% by weight, particularly preferably from about 70 to 85% by weight, based on the weight of the solids content of the composition.

Suitable binders also include polymeric compounds containing phenolic hydroxyl groups, such as polymers with vinyl phenol and esters or amides of acrylic acid and with (meth)acrylates or (meth)acrylamides of di- and polyhydroxy and aminohydroxy aromatics, such as hydroquinone, pyrocatechol, resorcinol, pyrogallol or hydroxyaniline. In addition to homopolymers, copolymers of the above-mentioned monomers with one another or with other polymerizable monomers, such as styrene, the methyl ester of (meth)acrylic acid and bisphenol-(meth)acrylate, can be used as binders in the compositions of the present invention. Mixtures of these polymers with novolaks can also be used. The types and quantities of these binders vary depending on the respective application, but the quantities used are substantially in the ranges indicated for the novolaks.

To produce specific properties, such as adhesion, smoothness of the surface and absorptivity, the radiation-sensitive composition can contain small quantities of other substances, such as wetting agents, adhesion promoters, dyes, etc.

When preparing the recording material of the present invention, the composition is in general dissolved in an organic solvent and then applied to an appropriate support. The solvent should be selected in accordance with the intended coating process, the layer thickness and the drying conditions. Solvents which can be used for the composition of the invention comprise, in particular, ketones, such as butanone and N-methylpyrrolidone; alkanediol monoalkyl ethers, such as ethylene glycol monomethyl ether and propylene glycol monomethyl ether and monoethyl ether; alkanediol ether acetates, such as ethylene glycol monoethyl ether acetate or propylene glycol monoalkyl ether acetates; and esters, such as butyl acetate. It is also possible to use solvent mixtures which, among others, may also contain xylene. In principle, all solvents can be used which do not irreversibly react with the layer components.

The radiation-sensitive composition according to the present invention can in particular be used in photoresists for the microelectronics industry. Preferred layer supports for this purpose comprise silicon discs which may also have an oxidized surface. Layers which are encountered in the customary microelectronic fabrication processes, for example layers of silicon nitride, polysilicon, silicon oxide, polyimides or metals, such as aluminum, and also doped silicon, can also be used as layer supports for the compositions according to the present invention. Discs of Ga/As alloys are also suitable layer supports. The compositions of the invention can further be employed in the manufacture of printed circuit boards, using layer supports which are conventionally employed in this application.

Furthermore, printing plates can be prepared with the composition according to the invention. The supports used for this purpose are, e.g., pretreated aluminum sheets.

The layer supports which are conventionally employed in the microelectronics industry are usually spin-coated. Coating techniques which can also be used for these and other layer supports include spray coating, roller coating, immersion, coating by means of slot dies, doctor knife coating or cast coating.

The aqueous alkaline solutions used for development remove those regions of the radiation-sensitive layer which have been affected by the light and thus produce a positive image of the master. Suitable developers comprise aqueous alkaline solutions which may be free of metal ions, but may also contain metal ions such as sodium and/or potassium ions.

The developer solutions may be buffered, for example with silicate, borate or phosphate solutions or mixtures of salt solutions and may also contain small quantities of surfactants.

A preferred application of the radiation-sensitive compositions according to the present invention is in lithographic processes for the manufacture of integrated circuits or discrete components. In this application, the compositions serve as masking materials for various process steps, for example etching of the layer support, implantation of ions in the layer support or deposition of materials on the layer support.

Important criteria for lithographic assessment are, among others, the resolution of a resist (i.e. the smallest patterns which can still be produced from a resist), the processing latitude (i.e. the change in pattern dimensions with changing exposure energy) and the radiation-sensitivity (i.e. the exposure energy which is required to obtain, by the lithographic process, a dimensionally true reproduction of the patterns of the exposure mask in the resist). To ensure a reproducible processing of the resists it is important that lithographic characteristics do not change during storage of the resist. It is also important that particles (crystals or gel particles) do not precipitate from the resist during storage, since this would impair the uniformity of the resist layer. Particles of this kind produce defects in the resist layer and, as a result of this, the yield obtained in the lithographic process is reduced. In addition, such particles frequently cause blocking in the filters of the pumps which transport the resist to the coating machine, and this means that filters must be exchanged more frequently.

The diazo mixtures of the invention give photoresists lithographic properties which are at least as good as those imparted by the esters of (naphthoquinone diazide)-sulfonic acids containing 2,3,4,4'-tetrahydroxybenzophenone as the only hydroxyl component; in addition to this, they clearly improve the radiation-sensitivity and, above all, the storage stability of the photoresists.

The following examples of radiation-sensitive compositions according to the present invention are not intended to limit the spirit of the invention. In the examples, parts by weight are indicated as pbw.

EXAMPLE 1

A solution of a radiation-sensitive composition is prepared from

| | |
|---|---|
| 72,8 pbw | of propylene glycol monomethyl ether acetate, |
| 20.8 pbw | of novolak, |
| 3.2 pbw | of the esterification product of 2,3,4,4'-tetrahydroxybenzophenone and (1,2-naphthoquinone 2-diazide)-5-sulfonic acid, comprising 88% by weight of the tetraester, and |
| 3.2 pbw | of 2,3,4-trihydroxybenzophenone, the hydroxyl groups of which are completely esterified with (1,2-naphthoquinone 2-diazide)-5-sulfonic acid. |

This solution is applied to a silicon disc by spin-coating such that, after drying on a hot plate at 90° C., a 1.2 μm thick layer is obtained. Exposure is then carried out through a mask, using an exposure apparatus conventionally employed in practice (a so-called "stepper" having an exposure wavelength of 436 nm and a numerical aperture of 0.35). After a further heat treatment on a hot plate, the coated silicon disc is immersed in a developer for 30 seconds, the resist regions affected by the light being removed in the process. By means of this procedure, patterns having dimensions down to 0.70 μm can be produced from the radiation-sensitive composition of the present invention (with dimensionally true reproduction even of the relatively large patterns), the exposure energy required in the process being only 240 mJ/cm².

The radiation-sensitive composition of the invention is stable over a period of at least 10 days at 50° C., without particles precipitating from the resist solution.

EXAMPLE 2

Example 1 is repeated, with the difference that the esters specified in that example are replaced by

| | |
|---|---|
| 3.2 pbw | of the esterification product of 2,3,4,4'-tetrahydroxybenzophenone and (1,2-naphthoquinone 2-diazide)-5-sulfonic acid, comprising 85% by weight of the tetraester, and |
| 3.2 pbw | of the esterification product of 2,3,4-trihydroxybenzophenone and (1,2-naphthoquinone 2-diazide)-5-sulfonic acid, comprising 90% by weight of the triester. |

Otherwise, the procedure of Example 1 is followed. Patterns having dimensions down to 0.70 μm can be produced (with dimensionally true reproduction even of the relatively large patterns), the exposure energy required being 250 mJ/cm².

A 25% variation of the exposure energy is possible, without changing the width of the 0.80 μm lines by more than the generally accepted measure of 10%.

The resist solution of the invention is stable over a period of at least 6 days at 50° C., without particles precipitating from the solution.

EXAMPLE 3

Example 1 is repeated, with the difference that the esters specified in that example are replaced by

| | |
|---|---|
| 3.2 pbw | of the esterification product of 2,3,4,4'-tetrahydroxybenzophenone and (1,2-naphthoquinone 2-diazide)-5-sulfonic acid, comprising 85% by weight of the tetraester, |
| 1.92 pbw | of 2,3,4-trihydroxybenzophenone, the hydroxyl groups of which are completely esterified with (1,2-naphthoquinone 2-diazide)-5-sulfonic acid, and |
| 1.28 pbw | of the esterification product of 2,3,4-trihydroxybenzophenone and (1,2-naphthoquinone 2-diazide)-5-sulfonic acid, comprising 40% by weight of the triester. |

Otherwise, the procedure of Example 1 is followed. Patterns having dimensions down to 0.70 μm can be produced (with dimensionally true reproduction even of the relatively large patterns), the exposure energy required being 220 mJ/cm$^2$. A 22% variation of the exposure energy is possible, without changing the width of the 0.80 μm lines by more than the generally accepted measure of 10%.

The resist solution of the invention is stable over a period of at least 6 days at 50° C., without particles precipitating from the solution.

COMPARATIVE EXAMPLE

Example 1 is repeated, with the difference that the esters specified in that Example are replaced by ---
6.4 pbw of the esterification product of 2,3,4,4'-tetrahroxybenzophenone and (1,2-naphthoquinone 2-diazide)-5-sulfonic acid, comprising 85% by weight of the tetraester
---

Otherwise, the procedure of Example 1 is followed. Patterns having dimensions down to 0.70 μm can be produced (with dimensionally true reproduction even of the larger patterns), the exposure energy required being 300 mJ/cm$^2$. A 28% variation of the exposure energy is possible, without changing the width of the 0.80 μm lines by more than the generally accepted measure of 10%.

The resist solution is stable, however, over a period of only 2 days at 50° C., without particles precipitating from the solution.

What is claimed is:

1. A coating composition comprising a radiation-sensitive composition comprising an admixture of
   (a) a polymeric binder which is insoluble in water but soluble or at least swellable in aqueous alkaline solution, and
   (b) an ester mixture comprising (i) a 2,3,4,4'-tetrahydroxybenzophenone which is partially esterified with at least one of (1,2-naphthoquinone 2-diazide)-4-sulfonic acid and (1,2-naphthoquinone 2-diazide)-5-sulfonic acid, and (ii) a compound selected from the group consisting of a dihydroxybenzophenone which is completely esterified with at least one of (1,2-naphthoquinone 2-diazide)-4-sulfonic acid and (1,2-naphthoquinone 2-diazide)-5-sulfonic acid, and a trihydroxybenzophenone which is partially or completely esterified with at least one of (1,2-naphthoquinone 2-diazide)-4-sulfonic acid and (1,2-naphthoquinone 2-diazide)-5-sulfonic acid,
   wherein the weight ratio of esterified 2,3,4,4'-tetrahydroxybenzophenone to esterified di- or trihydroxybenzophenone is from about 4.5:5.5 to 7:3, and said ester mixture is present in an amount from about 5 to 40% by weight of said composition, based on the total weight of solids in said composition, and
   wherein said tetraester is present in said ester mixture in an amount from about 80 to 95% by weight, based on the total weight of said partially or completely esterified tetrahydroxy-benzophenone in said mixture, and
   propylene glycol monoalkylether acetate as a solvent.

2. A coating composition as claimed in claim 1, wherein said ester mixture is present in an amount from about 10 to 35% by weight of said composition, based on the total weight of solids in said composition.

3. A coating composition as claimed in claim 2, wherein said ester mixture is present in an amount from about 15 to 30% by weight of said composition, based on the total weight of solids in said composition.

4. A coating composition as claimed in claim 1, wherein said triester is present in said ester mixture in an amount from about 70 to 100% by weight, based on the total weight of said partially or completely esterified trihydroxybenzophenone in said ester mixture.

5. A coating composition as claimed in claim 4, wherein said tetraester is present in said ester mixture in an amount from about 80 to 90% by weight, and said triester is present in said ester mixture in an amount from about 75 to 95% by weight.

6. A coating composition as claimed in claim 5, wherein said triester is present in said ester mixture in an amount from about 80 to 90% by weight.

7. A coating composition as claimed in claim 1, wherein the weight ratio of esterified 2,3,4,4'-tetrahydroxybenzophenone to esterified di- or trihydroxybenzophenone is between about 4.5:5.5 and 5.5:4.5.

8. A coating composition as claimed in claim 1, wherein said polymeric binder is a novolak.

9. A coating composition as claimed in claim 8, wherein the novolak is present in about 65 to 90% by weight of the solids content of the composition.

10. A coating composition as claimed in claim 1, consisting essentially of the recited constituents.

11. A coating composition as claimed in claim 1, wherein (ii) comprises a dihydroxybenzophenone which is completely esterified with at least one of (1,2-naphthoquinone 2-diazide)-4-sulfonic acid and (1,2-naphthoquinone 2-diazide)-5-sulfonic acid.

12. A coating composition as claimed in claim 1, wherein (ii) comprises a trihydroxybenzophenone which is completely esterified with at least one of (1,2-naphthoquinone 2-diazide)-4-sulfonic acid and (1,2-naphthoquinone 2-diazide)-5-sulfonic acid.

13. A coating composition as claimed in claim 1, wherein (ii) comprises a trihydroxybenzophenone which is partially esterified with at least one of (1,2-naphthoquinone 2-diazide)-4-sulfonic acid and (1,2-naphthoquinone 2-diazide)-5-sulfonic acid.

14. A coating composition as claimed in claim 1, wherein (ii) comprises esterified 2,3,4-trihydroxybenzophenone.

15. A coating composition as claimed in claim 1, wherein the binder comprises a polymer containing phenolic hydroxyl groups.

16. A coating composition as claimed in claim 1, wherein the solvent comprises propylene glycol monomethylether acetate.

17. A coating composition as claimed in claim 1, wherein each of components (i) and (ii) contain esterified products formed from the 5-sulfonic acid.

18. A coating composition as claimed in claim 1, wherein component (ii) comprises an admixture of partially and fully esterified esters.

19. A radiation-sensitive recording material comprising a layer support and a radiation-sensitive layer applied thereto, wherein said radiation-sensitive layer is applied by coating a coating composition as claimed in claim 1 on to the layer support.

20. A method of making a recording material comprising applying to a substrate a coating composition as claimed in claim 1.

* * * * *